United States Patent
Shih (10) Patent No.: US 12,009,296 B2
(45) Date of Patent: Jun. 11, 2024

(54) SEMICONDUCTOR DEVICE AND MANUFACTURING METHOD THEREOF

(71) Applicant: Taiwan Semiconductor Manufacturing Company, Ltd., Hsinchu (TW)

(72) Inventor: Wei-Kai Shih, Nantou County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 199 days.

(21) Appl. No.: 17/461,924

(22) Filed: Aug. 30, 2021

(65) Prior Publication Data
US 2023/0063261 A1 Mar. 2, 2023

(51) Int. Cl.
| H01L 21/00 | (2006.01) |
| H01L 23/00 | (2006.01) |
| H01L 23/31 | (2006.01) |
| H01L 23/528 | (2006.01) |

(52) U.S. Cl.
CPC ........ *H01L 23/528* (2013.01); *H01L 23/3171* (2013.01); *H01L 24/03* (2013.01); *H01L 24/05* (2013.01); *H01L 2224/02311* (2013.01); *H01L 2224/02313* (2013.01); *H01L 2224/02373* (2013.01); *H01L 2224/0401* (2013.01)

(58) Field of Classification Search
CPC .... H01L 23/528; H01L 23/3171; H01L 24/03
See application file for complete search history.

(56) References Cited

U.S. PATENT DOCUMENTS

| 9,812,410 B2* | 11/2017 | Ho ............... H01L 23/3107 |
| 9,960,106 B2* | 5/2018 | Chen ............... H01L 21/568 |
| 10,157,863 B2* | 12/2018 | Ho ............... H01L 23/49816 |
| 10,164,001 B1* | 12/2018 | Lee ............... H01L 24/05 |
| 10,170,536 B1* | 1/2019 | Hsu ............... H01L 23/3171 |
| 10,541,297 B2* | 1/2020 | Lee ............... H01L 24/05 |
| 11,011,600 B2* | 5/2021 | Lee ............... H01L 24/05 |
| 11,362,064 B2* | 6/2022 | Chen ............... H01L 25/105 |
| 11,362,069 B2* | 6/2022 | Chen ............... H01L 24/08 |
| 11,417,629 B2* | 8/2022 | Chen ............... H01L 24/89 |
| 11,581,250 B2* | 2/2023 | Chen ............... H01L 23/5389 |
| 11,611,193 B2* | 3/2023 | Charlebois ........ H01L 23/49589 |
| 11,664,411 B2* | 5/2023 | Lee ............... H01L 28/10 336/200 |
| 2017/0194268 A1* | 7/2017 | Ho ............... H01L 24/17 |
| 2018/0061783 A1* | 3/2018 | Ho ............... H01L 21/4853 |
| 2018/0366536 A1* | 12/2018 | Hsu ............... H01L 23/5226 |

(Continued)

FOREIGN PATENT DOCUMENTS

| CN | 104009019 A * | 8/2014 | ............ H01L 21/50 |
| DE | 102020112959 A1 * | 6/2021 | ........ H01L 21/4853 |
| WO | WO-9960106 A2 * | 11/1999 | ........... C07K 14/415 |

*Primary Examiner* — Laura M Menz
(74) *Attorney, Agent, or Firm* — JCIPRNET (57) ABSTRACT

Semiconductor device and method of forming the same are disclosed. One of the semiconductor devices includes a semiconductor substrate, a passivation layer and a conductive pattern. The semiconductor substrate includes a conductive pad thereover. The passivation layer over the semiconductor substrate. The conductive pattern is penetrating through the passivation layer and electrically connected to the conductive pad, wherein a sidewall of the conductive pattern has at least one turning point.

20 Claims, 11 Drawing Sheets

(56) References Cited

U.S. PATENT DOCUMENTS

| | | | |
|---|---|---|---|
| 2019/0109185 A1* | 4/2019 | Lee | H01L 27/01 |
| 2019/0273057 A1* | 9/2019 | Ogata | H01L 23/3192 |
| 2020/0152728 A1* | 5/2020 | Lee | H01L 27/01 |
| 2021/0066255 A1* | 3/2021 | Chen | H01L 21/565 |
| 2021/0098423 A1* | 4/2021 | Chen | H01L 21/76877 |
| 2021/0242303 A1* | 8/2021 | Lee | H01L 27/01 |
| 2021/0249380 A1* | 8/2021 | Chen | H01L 25/105 |
| 2022/0223550 A1* | 7/2022 | Chen | H01L 24/16 |
| 2022/0262772 A1* | 8/2022 | Chen | H01L 25/0657 |
| 2022/0285324 A1* | 9/2022 | Chen | H01L 21/561 |
| 2022/0336414 A1* | 10/2022 | Chen | H01L 24/08 |
| 2023/0063261 A1* | 3/2023 | Shih | H01L 24/13 |

* cited by examiner

SEMICONDUCTOR DEVICE AND MANUFACTURING METHOD THEREOF

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers to form circuit components and elements thereon.

Generally, a post-passivation interconnect (PPI) structure such as redistribution structure (RDLs) are formed on passivation layers. Polymer layers and bumps are then formed over the PPI structure.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Figure 1A:
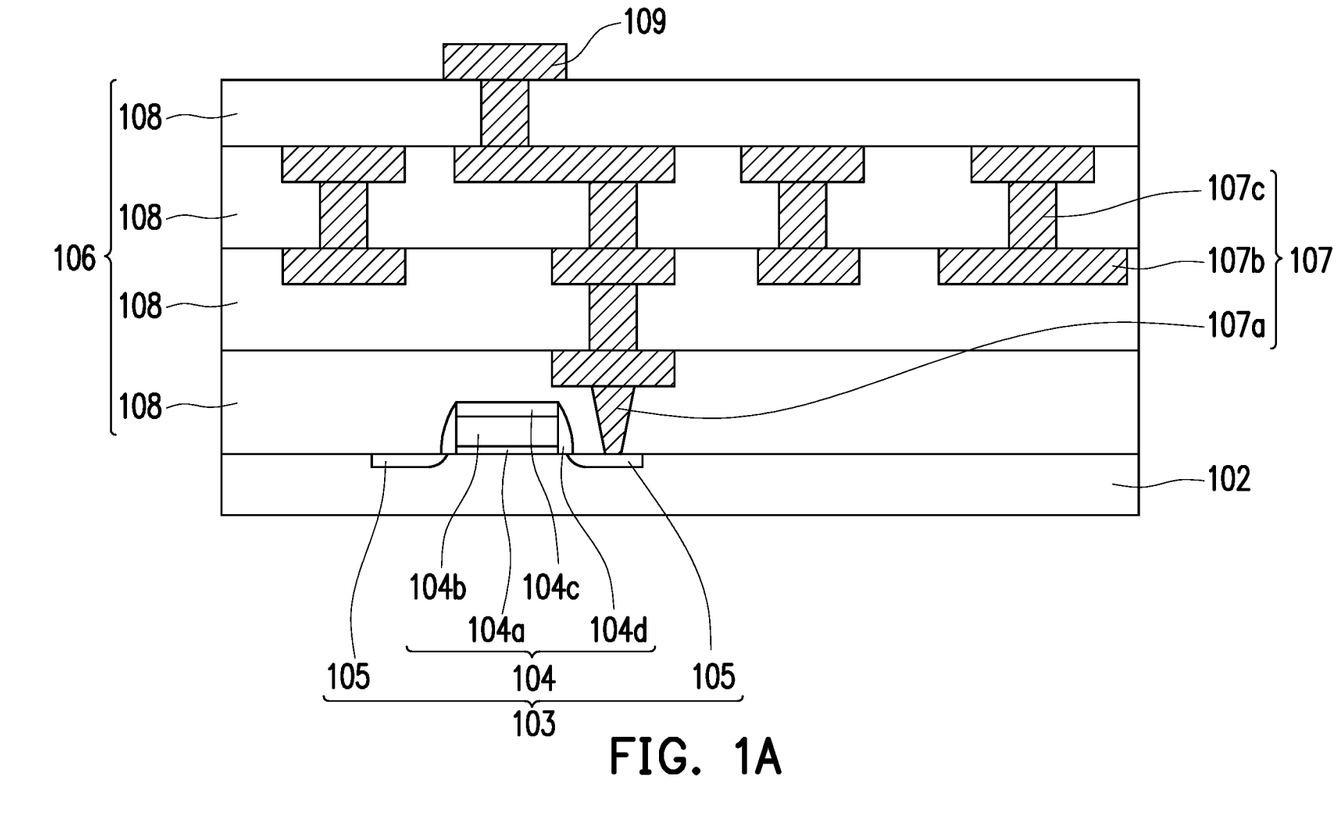
FIG. 1A to FIG. 1F are schematic cross sectional views illustrating various stages in a manufacturing method of a semiconductor device according to some embodiments of the disclosure.
Figure 1B:
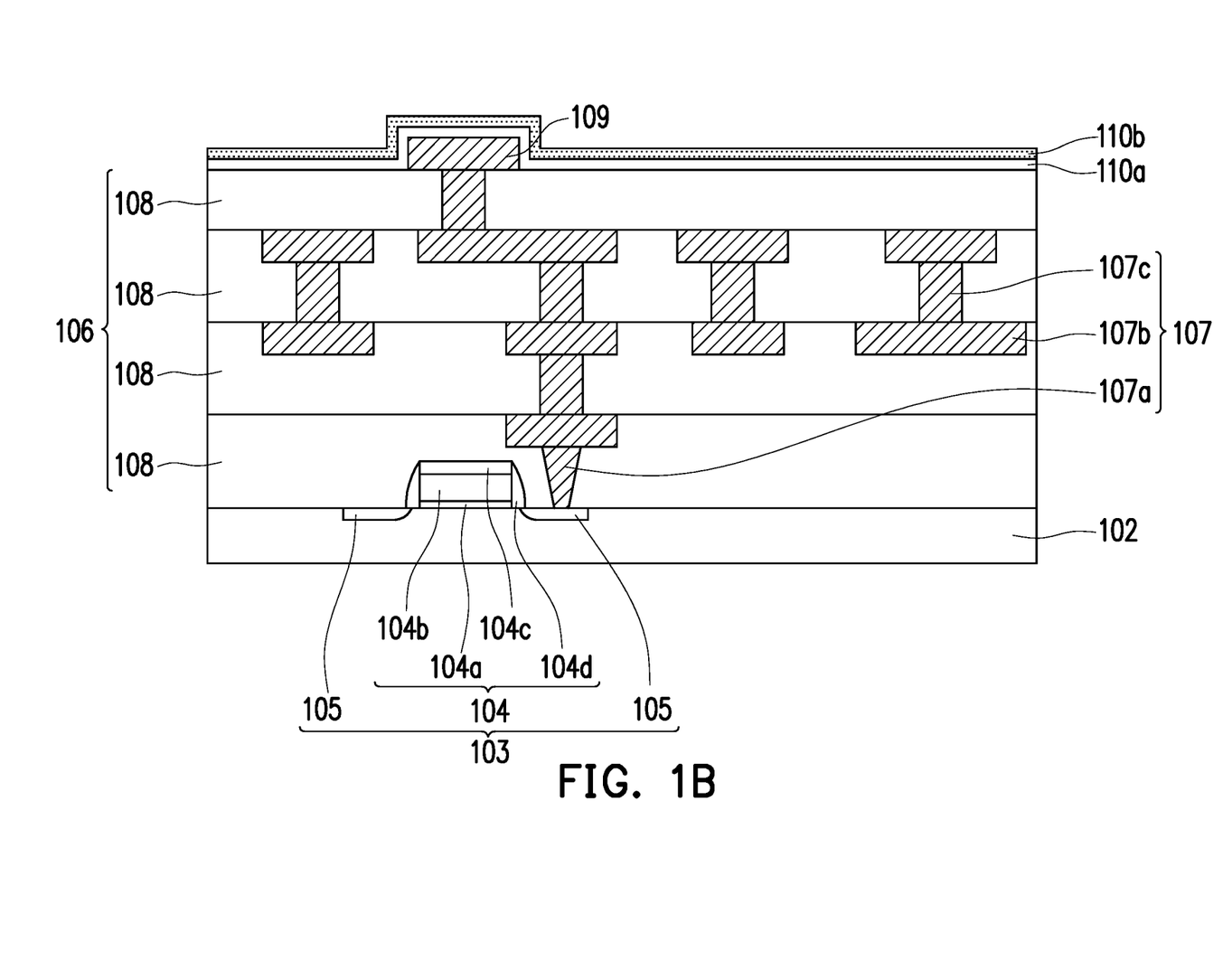
Figure 1C:
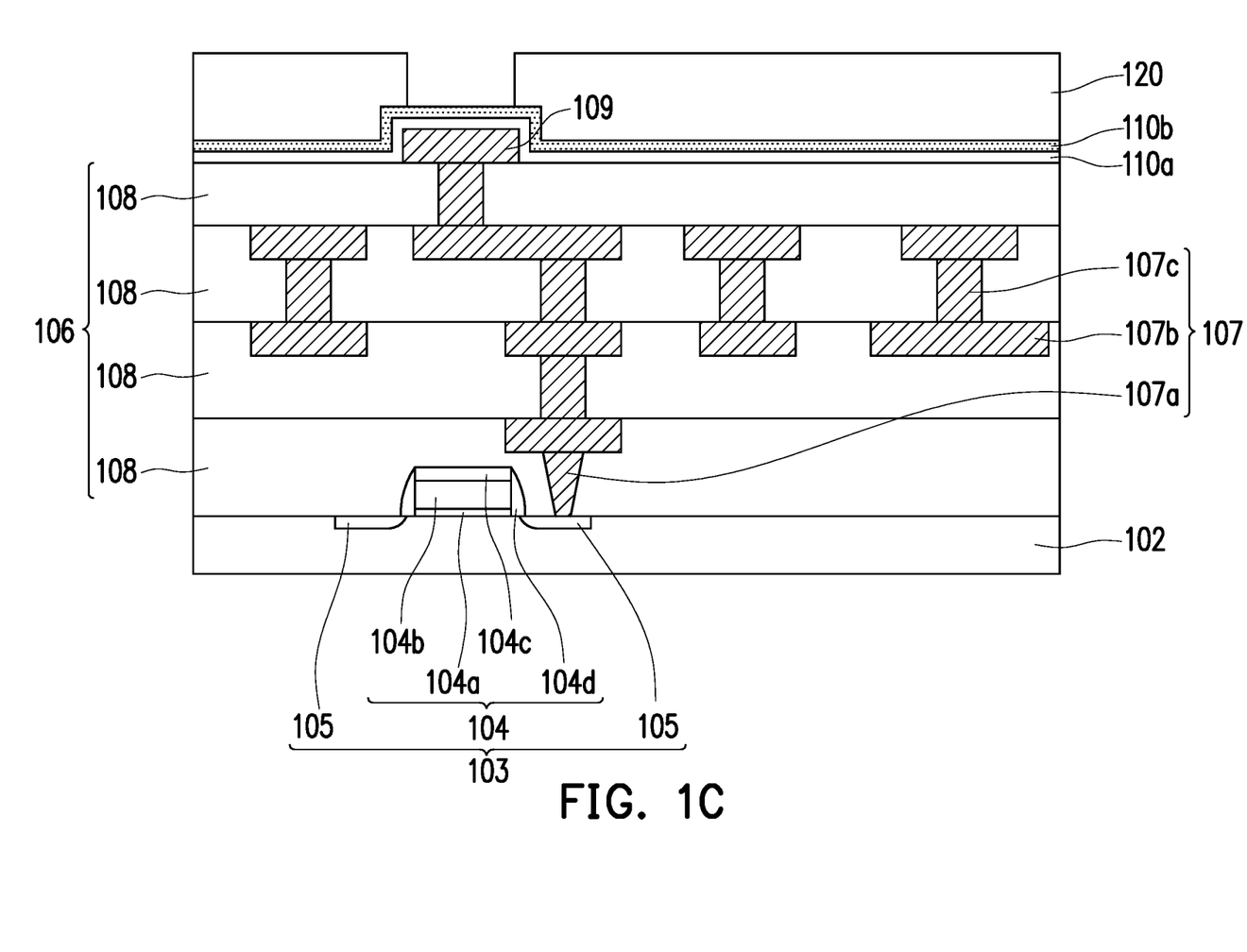
Figure 1D:
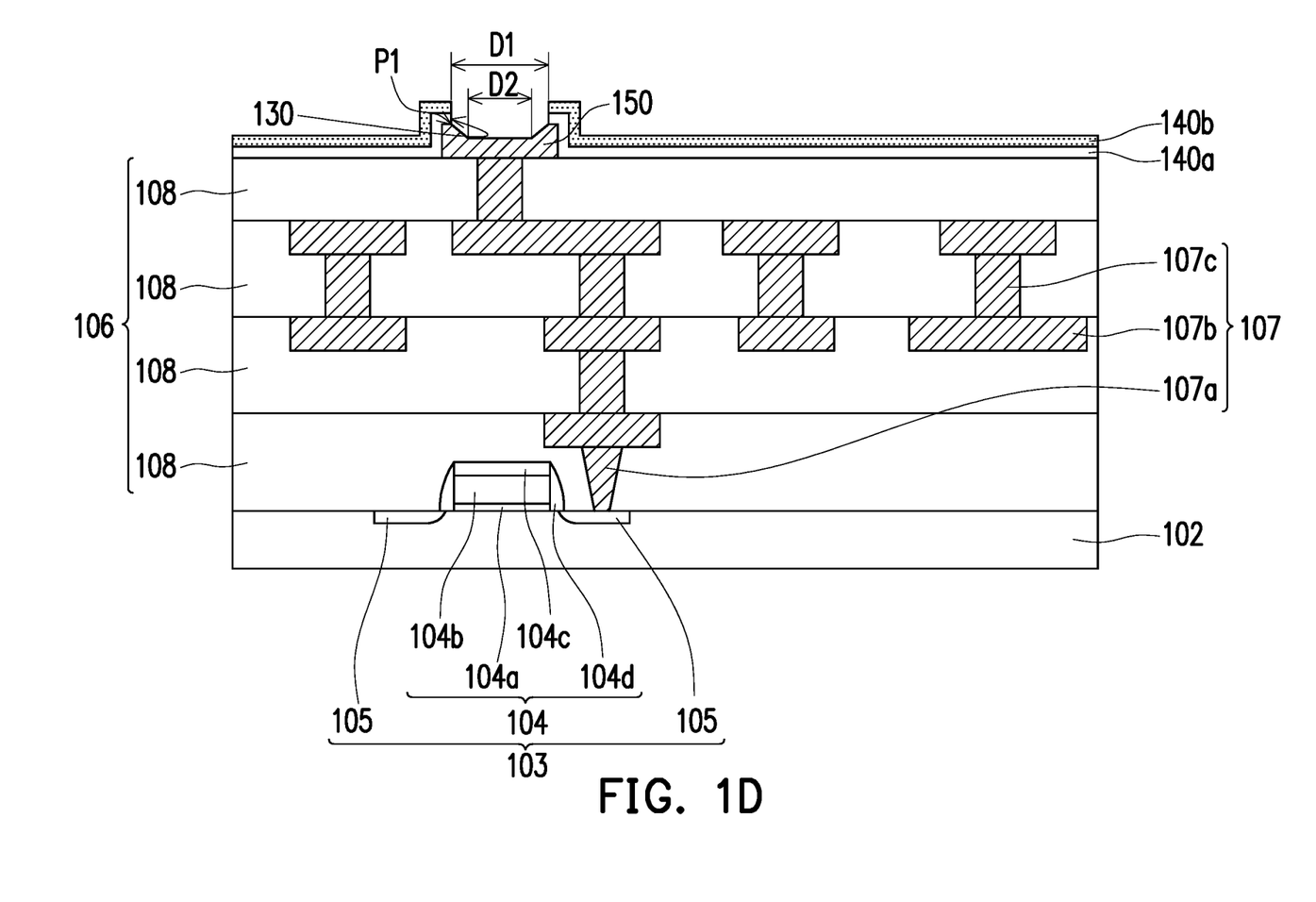
Figure 1E:
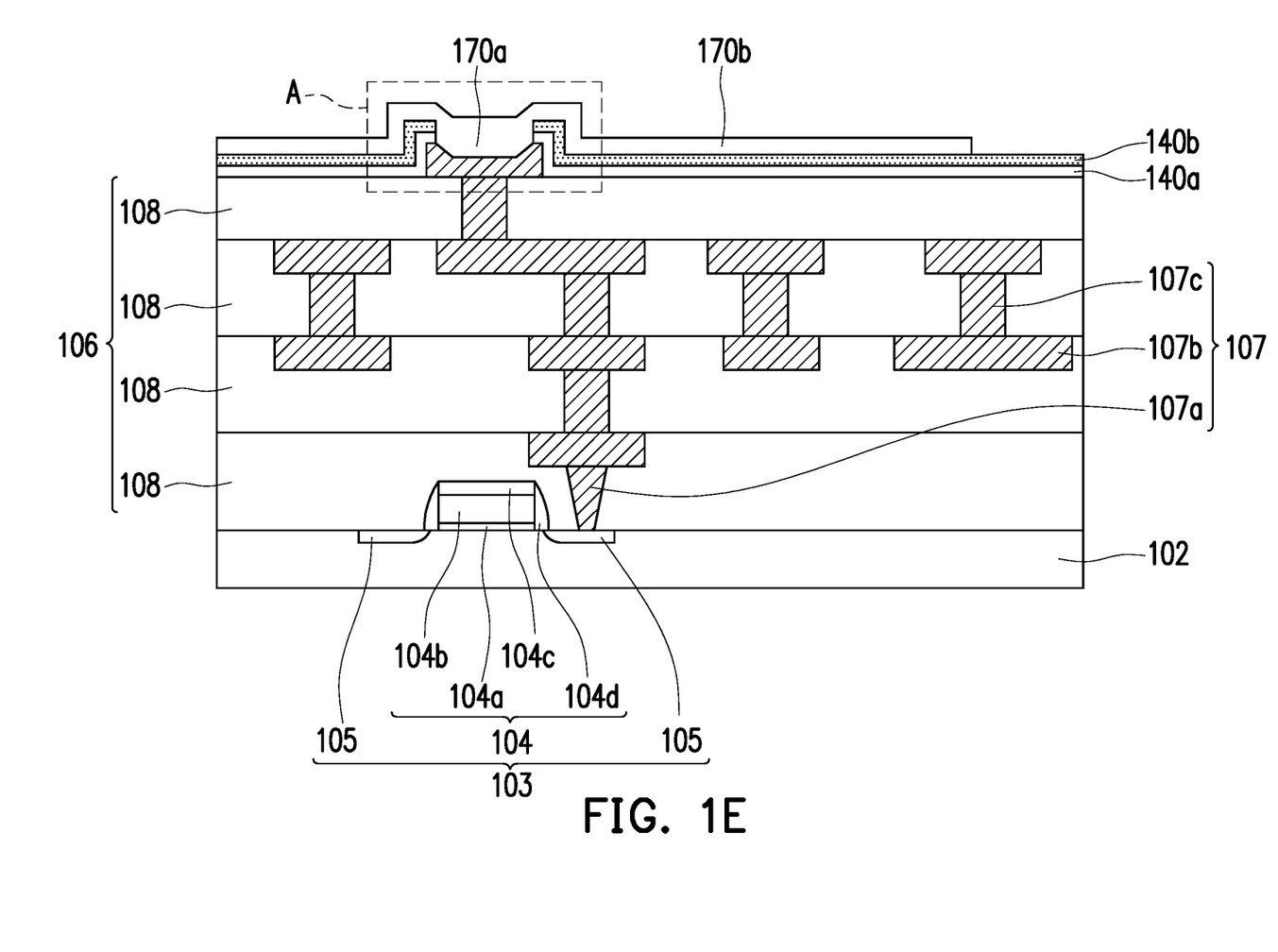
Figure 2A:
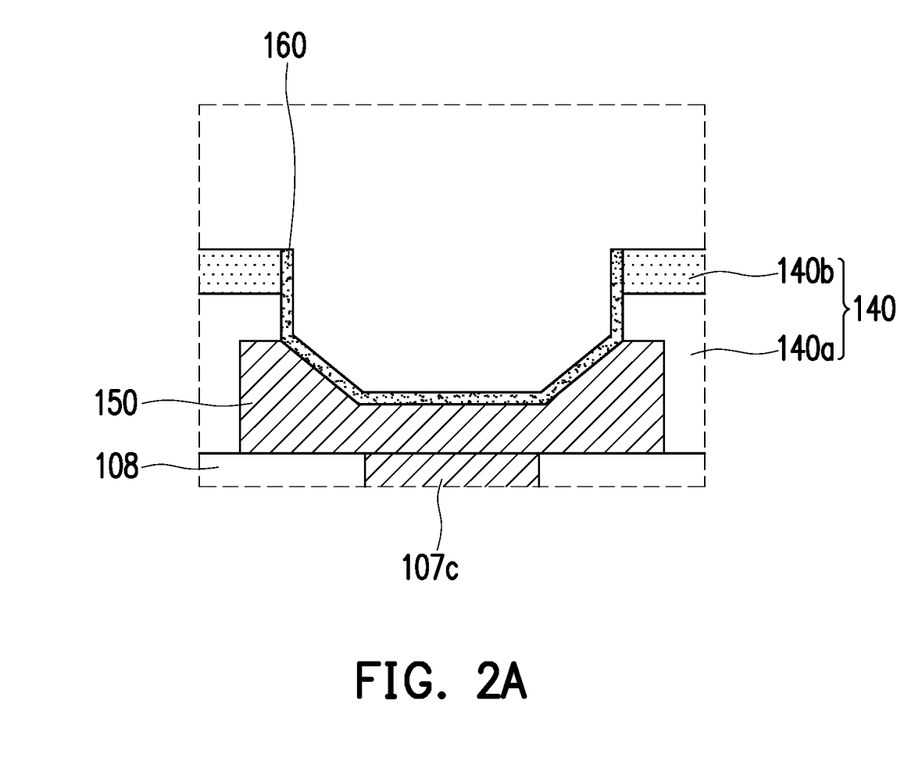
FIG. 2A is a schematic cross sectional view illustrating a step of forming an opening in a manufacturing method of a semiconductor device according to some embodiments of the disclosure.
Figure 2B:
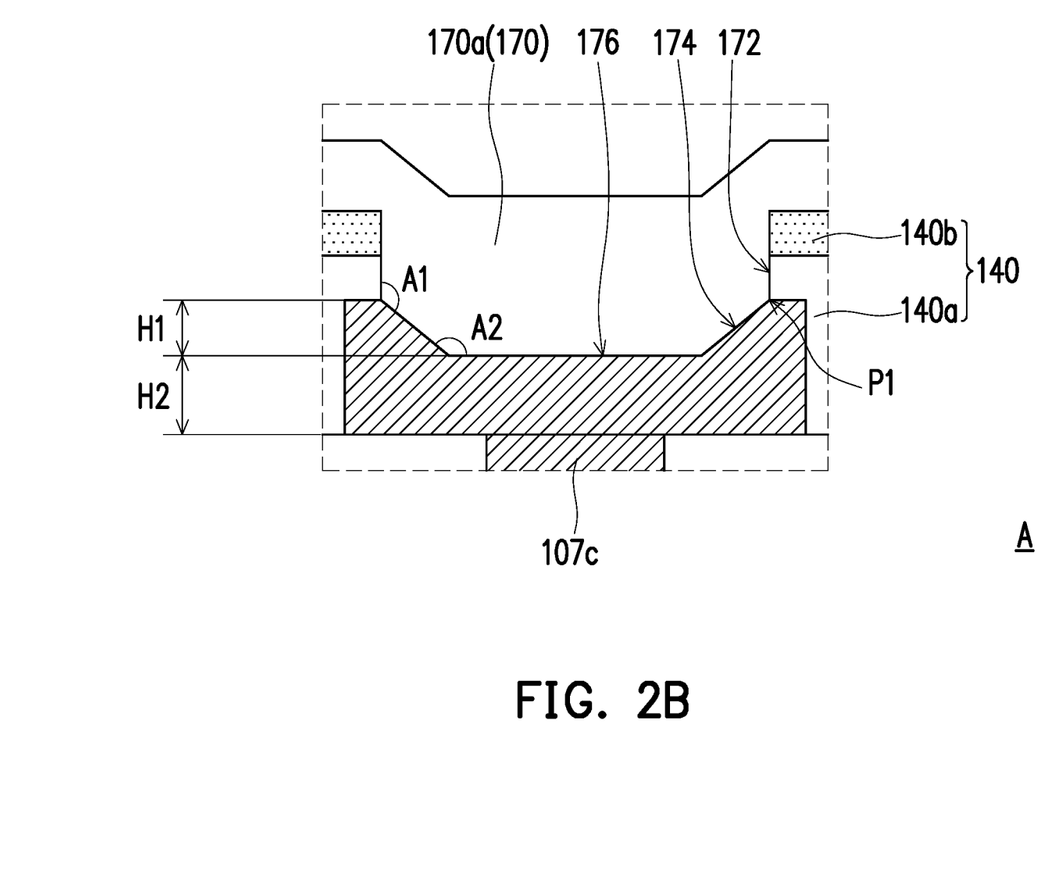
FIG. 2B is an enlarged view of a region A of FIG. 1E, illustrating a post-passivation interconnect (PPI) structure in accordance with some embodiments of the disclosure.
Figure 3:
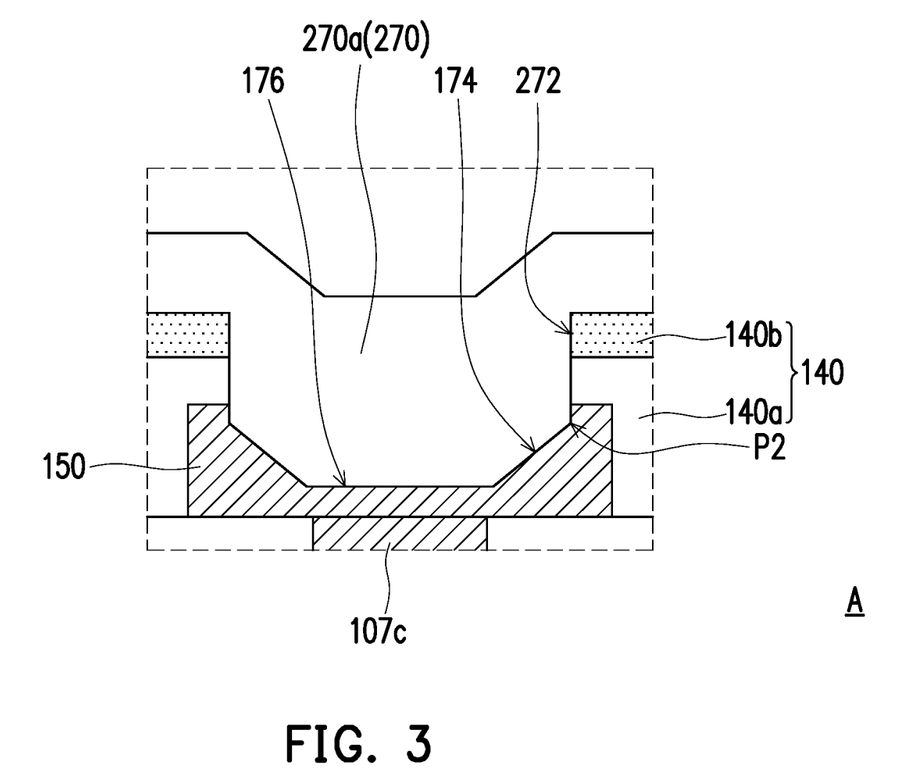
FIG. 3 is an enlarged view of a region A of FIG. 1E, illustrating a post-passivation interconnect (PPI) structure in accordance with some embodiments of the disclosure.
Figure 4:
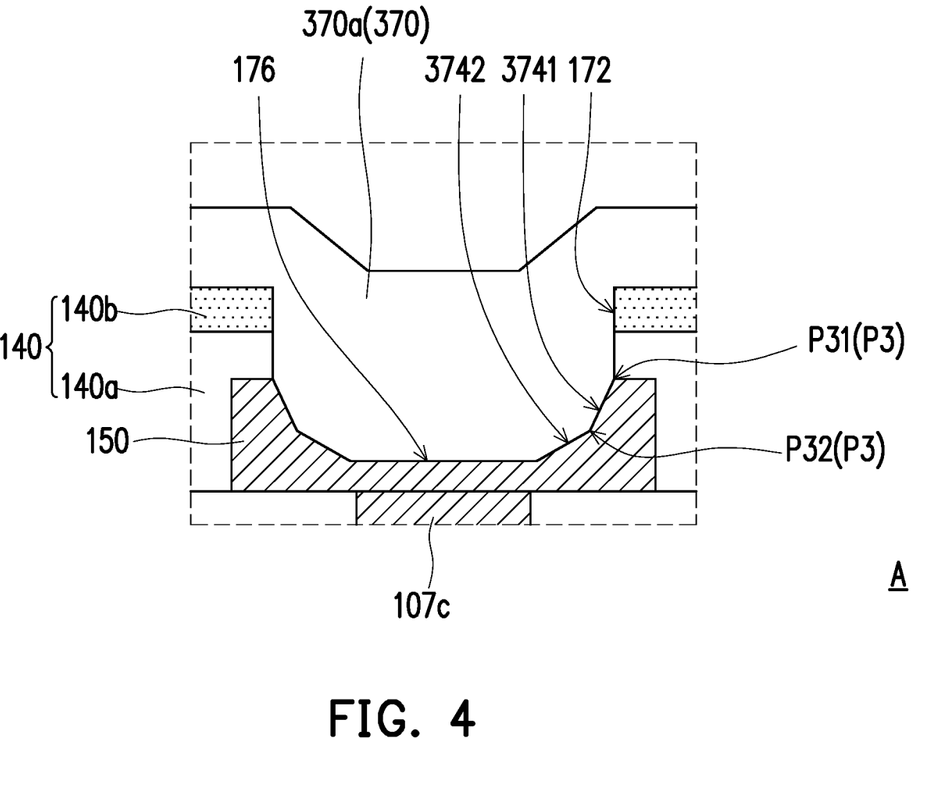
FIG. 4 is an enlarged view of a region A of FIG. 1E, illustrating a post-passivation interconnect (PPI) structure in accordance with alternative embodiments of the disclosure.
Figure 5:
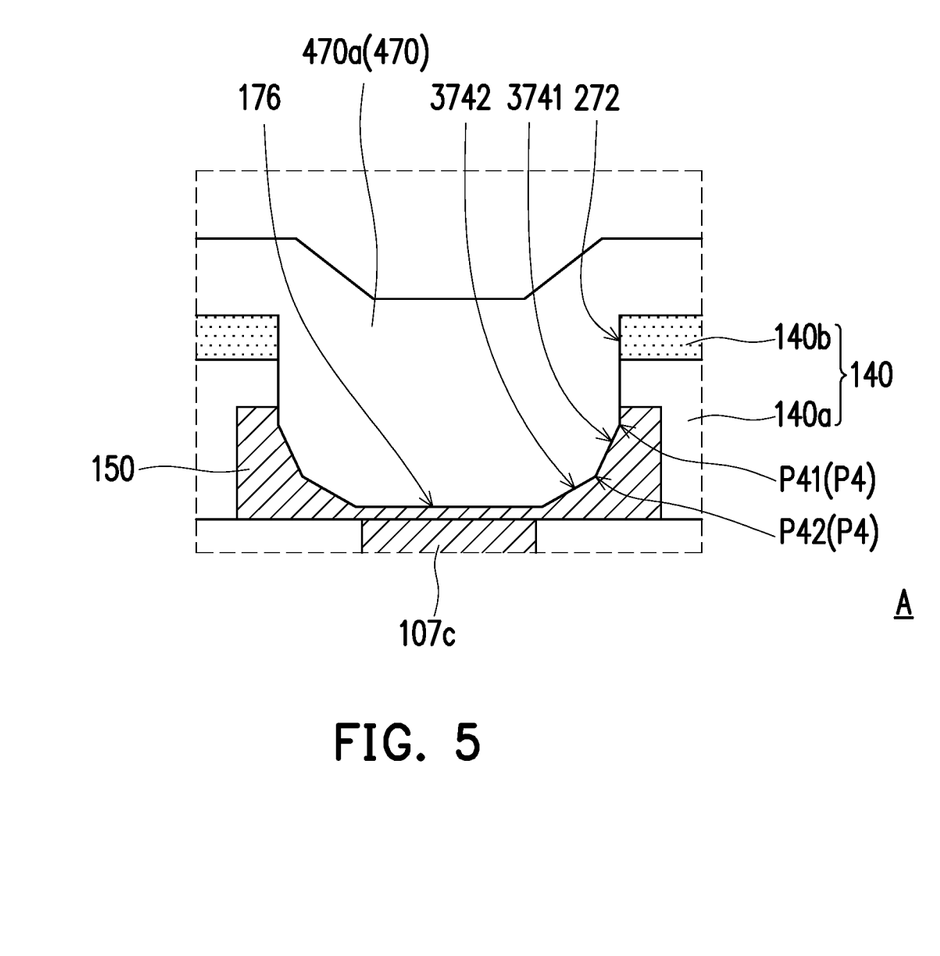
FIG. 5 is an enlarged view of a region A of FIG. 1E, illustrating a post-passivation interconnect (PPI) structure in accordance with alternative embodiments of the disclosure.

FIG. 1A to FIG. 1F are schematic cross sectional views illustrating various stages in a manufacturing method of a semiconductor device according to some embodiments of the disclosure. FIG. 2A is a schematic cross sectional view illustrating during removing the portions of the passivation layer and the conductive pad in a manufacturing method of a semiconductor device according to some embodiments of the disclosure. FIG. 2B is an enlarged view of a region A of FIG. 1E, illustrating a post-passivation interconnect (PPI) structure in accordance with some embodiments of the disclosure. FIG. 3 is an enlarged view of a region A of FIG. 1E, illustrating a post-passivation interconnect (PPI) structure in accordance with some embodiments of the disclosure. FIG. 4 is an enlarged view of a region A of FIG. 1E, illustrating a post-passivation interconnect (PPI) structure in accordance with alternative embodiments of the disclosure. FIG. 5 is an enlarged view of a region A of FIG. 1E, illustrating a post-passivation interconnect (PPI) structure in accordance with alternative embodiments of the disclosure.

Referring to FIG. 1A, a semiconductor substrate 102 with a conductive pattern thereover is provided. The semiconductor substrate 102 may be a semiconductor substrate, such as a bulk semiconductor, a semiconductor-on-insulator (SOI) substrate, or the like, which may be doped (e.g., with a p-type or an n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the semiconductor substrate 102 includes silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

In some embodiments, at least one active device 103 is formed over/in the semiconductor substrate 102. For example, the semiconductor substrate 102 has at least one active region defined by isolation regions such as shallow trench isolations (STIs) (not shown), and the active device 103 is formed in the active region. The active device 103 may be a transistor and include a gate structure 104 on the semiconductor substrate 102, and source/drain regions 105 disposed in the semiconductor substrate 102 at opposite sides of the gate structure 104. In some embodiments, the gate structure 104 includes a gate dielectric layer 104a, a gate electrode 104b, a cap layer 104c, and a spacer 104d. The gate dielectric layer 104a, the gate electrode 104b, the cap layer 104c, and the spacer 104d may be form by suitable material and method. In some embodiments, there are more than one active device 103 (although one is shown). In addition, passive components (not shown) (e.g., resistors, capacitors, inductors or the like) may be optionally formed over/in the semiconductor substrate 102.

In some embodiments, an interconnect structure 106 is formed over the semiconductor substrate 102 to electrically connected to the active device 103. The interconnect structure 106 may include a plurality of conductive features 107 and a plurality of insulating layers 108 alternately configured. The conductive features 107 may include a conductive contact 107a, a conductive line 107b, and a conductive via 107c which are electrically connected with one another. In some embodiments, the conductive contact 107a is formed between and electrically connected to the source/drain region 105 of the active device 103 and the conductive line 107b. The conductive via 107c may be formed between and in contact with two conductive line 107b, so that the active device 103 may be electrically connected with other components. In some embodiments, the material of conductive features 107 includes tungsten (W), copper (Cu), a copper alloy, aluminum (Al), an aluminum alloy or a combination thereof, and the material of insulating layers 108 include silicon oxide, silicon oxynitride, silicon nitride, a low dielectric constant (low-k) material or a combination thereof.

In some embodiments, the conductive pad 109 is formed over and electrically connected to the interconnect structure 106. For example, the conductive pad 109 is electrically connected to the interconnect structure 106 through the conductive via 107c. In some embodiments, the interconnect structure 106 is disposed between the active device 103 and the conductive pad 109. In some embodiments, the conductive pad 109 is also referred to as the topmost conductive feature 107 of the interconnect structure 106. In some embodiments, the material of conductive pad 109 includes tungsten (W), copper (Cu), a copper alloy, aluminum (Al), an aluminum alloy or a combination thereof.

Referring to FIG. 1B, at least one passivation layer 110a, 110b is formed over the semiconductor substrate 102 to cover the conductive pad 109. In some embodiments, the passivation layer 110a is formed over the interconnect structure 106 and the conductive pad 109, and the passivation layer 110b is formed over the passivation layer 110a. In some embodiments, the passivation layer 110a is conformally formed on the conductive pad 109, so that a sidewall and a top surface of the conductive pad 109 are entirely covered by the passivation layer 110a. The passivation layer 110a may be in direct contact with the sidewall and the top surface of the conductive pad 109. The passivation layer 110b is conformally formed over the passivation layer 110a, for example. In some embodiments, the passivation layer 110a, 110b includes a dielectric material, such as undoped silicate glass (USG), silicon nitride, silicon oxide, silicon oxynitride or a non-porous material by any suitable method, such as CVD, PVD, or the like. In some embodiments, the material of the passivation layer 110a is different from the material of the passivation layer 110b. For example, the material of the passivation layer 110a is silicon oxide, and the material of the passivation layer 110b is silicon nitride. In some embodiments, the thickness of the passivation layer 110a is different from the thickness of the passivation layer 110b. For example, the thickness of the passivation layer 110a is greater than the thickness of the passivation layer 110b. However, the disclosure is not limited thereto.

Referring to FIG. 1C, a photoresist layer 120 is formed over the passivation layer 110b and exposes a portion of the passivation layer 110b over the conductive pad 109. In some embodiments, the photoresist layer 120 is a positive photoresist or a negative photoresist, and the photoresist layer 120 is made of Poly (methyl methacrylate) (PMMA), Poly (methyl glutarimide) (PMGI) or other suitable material. The photoresist layer 120 may be formed by a spin-coating process or other suitable method.

Referring to FIG. 1C and FIG. 1D, using the photoresist layer 120 as a mask, portions of the passivation layer 110a, 110b and the conductive pad 109 are removed by an etching process, so as to form an opening 130. In some embodiments, the etching process include a dry etching process or a wet etching process. During the step of removing portions of the passivation layer 110a, 110b and the conductive pad 109, as shown in FIG. 2A, a polymer layer 160 is formed by residues of the etching process, and the polymer layer 160 is continuously deposited at the opening 130. For example, the polymer layer 160 is continuously deposited on a sidewall and a bottom of the opening 130 formed in the passivation layer 110a, 110b and the conductive pad 109. The continuously deposited polymer layer 160 will slows down the etching rate. Since the etching rate of the conductive pad 109 is decreased as an amount of the polymer layer 160 deposited on the conductive pad 109 is increased, the opening 130 is formed with a tapered sidewall. In some embodiments, the residues of the etching process include etched portions of the passivation layers 110a, 110b, the conductive pad 109, and the photoresist layer 120. In some embodiments, during the formation of the opening 130 of FIG. 1D, the polymer layer 160 is continuously deposited without being removed. That is, before the formation of the opening 130 is complete, the deposited polymer layer 160 is not removed by any removal process. For example, the etching process for forming the opening 130 is not interrupted by any removal process, and no other process (e.g., cleaning process) is introduced to remove the polymer layer 160 until the opening 130 is formed. Therefore, a thickness of the polymer layer 160 at the opening 130 is increased continuously. Because the polymer layer 160 is continuously accumulated at a surface of the conductive pad 109, the removal process of the conductive pad 109 is hindered and thus the etching rate on the conductive pad 109 and the removal amount of the conductive pad 109 is gradually decreased.

In some embodiments, a top dimension (e.g., a top width) D1 of the opening 130 is greater than a bottom dimension (e.g., a bottom width) D2 of the opening 130. The top dimension D1 of a top of the opening 130 may be greater than 3 micrometers. In some embodiments, a thickness of the polymer layer 160 formed on the opening 130 is uniform.

In some embodiments, the polymer layer 160 is formed with a desired thickness by adjusting an etching time, and thus the opening 130 may be formed with a turning point P1 on the sidewall of the opening 130. In an embodiment, the etching time is 355 second (s) to 410 second (s). In an embodiment, the etching time is 425 second (s) to 490 second (s). In some embodiments, after the opening 130 is completely formed, the photoresist layer 120 and the polymer layer 160 are removed. In some embodiments, since the polymer layer 160 is not removed until the opening 130 is formed, the polymer layer 160 is used as a blocking layer, and the etching rate of the etching process during the formation of the opening 130 is adjusted. Thus, a desired configuration of the opening 130 with a turning point P1 may be formed, and the conductive pad 109 under the opening is not over-etched.

Referring to FIG. 1E and FIG. 2B, a post-passivation interconnect (PPI) structure 170 is formed over the passivation layer 140a, 140b and electrically connected to the conductive pad 150. In some embodiments, the PPI structure 170 includes a conductive pattern 170a in the opening 130 and a conductive pattern 170b extending over the passivation layer 140a, 140b. In some embodiments, the conductive pattern 170a (also referred to as a first portion of the PPI structure 170) is penetrating through the passivation layer 140a, 140b and portions of the conductive pad 150, and a sidewall of the conductive pattern 170a has at least one turning point P1. In some embodiments, a height of the turning point P1 is substantially at a same level with an interface (i.e., a horizontal interface) of the passivation layer 140a and the conductive pad 150. In some embodiments, the turning point P1 at a plane extended from a top of the conductive pad 150. In some embodiments, a width of the conductive pattern 170a decreases from the turning point P1 to the semiconductor substrate 102. In some embodiments, a width of the conductive pad 150 increases from the turning point P1 to the semiconductor substrate 102.

In some embodiments, the conductive pattern 170a has a first sidewall 172, a second sidewall 174 and a bottom 176, and the second sidewall 174 is disposed between the first sidewall 172 and the bottom 176. In some embodiments, a first angle A1 formed between the first sidewall 172 and the second sidewall 174 is an obtuse angle, and a second angle A2 formed between the second sidewall 174 and the bottom 176 is an obtuse angle. As such, the stress at the bottom corner of the PPI structure 170 may be reduced and the performance of the PPI structure 170 in the thermal shock test may be improved. In some embodiments, the first angle A1 is 100°, 110°, 120°, 130°, 140°, 150°, 160°, 170° or in a range therebetween, and the second angle A2 is 100°, 110°, 120°, 130°, 140°, 150°, 160°, 170° or in a range therebetween. In some embodiments, the first sidewall 172 is a substantially vertical to the bottom 176. In some embodiments, a first portion of the conductive pattern 170a is embedded in the conductive pad 150. For example, the conductive pad 150 has a recess, and the first portion of the conductive pattern 170a is disposed in the recess. In some embodiments, a height H1 of the first portion of the conductive pattern 170a is less than a height H2 of a portion of the conductive pad 150 below the conductive pattern 170a. For example, the height H1 is in a range of 0.5 to 5000 angstroms (Å), and the height H2 is 6 to 35000 angstroms (Å).

The PPI structure may have other configurations. In alternative embodiments, as shown in FIG. 3, the PPI structure 270 is similar to the PPI structure 170 of FIG. 2B, except that a height of the turning point P2 is at a lower level with respect to the interface (i.e., the horizontal interface) of the passivation layer 140a and the conductive pad 150. In such embodiments, the turning point P2 below a virtual plane of a top of the conductive pad 150. In some embodiments, a width of the conductive pattern 170a decreases from the turning point P2 to the semiconductor substrate 102. In some embodiments, a width of the conductive pad 150 increases from the turning point P2 to the semiconductor substrate 102. In some embodiments, the conductive pattern 270a (a first portion of the PPI structure 270) has a first sidewall 272, and the first sidewall 272 interfaces with the passivation layer 140a, the passivation layer 140b and the conductive pad 150.

In alternative embodiments, as shown in FIG. 4, the PPI structure 370 is similar to the PPI structure 170 of FIG. 2B, except that more turning points P3 are formed. The turning points P3 include a first turning point P31 and a second turning point P32. In some embodiments, a height of the first turning point P31 is greater than a height of the second turning point P32. In some embodiments, the second turning point P32 is closer to a bottom 176 of the conductive pattern 370a than the first turning point P31.

In some embodiments, a height of the first turning point P31 is substantially at a same level with the interface (i.e., the horizontal interface) of the passivation layer 140a and the conductive pad 150, and a height of the turning point P32 is at a lower level with respect to the interface (i.e., the horizontal interface) of the passivation layer 140a and the conductive pad 150. In some embodiments, a second sidewall 3741 and a second sidewall 3742 of the PPI structure 370 are connected to and disposed between the first sidewall 172 and the bottom 176 of the conductive pattern 370a, and the second sidewall 3741 and the second sidewall 3742 have different slope. For example, a slope of the second sidewall 3741 is greater than a slope of the second sidewall 3742.

In alternative embodiments, as shown in FIG. 5, the PPI structure 470 is similar to the PPI structure 370 of FIG. 4, and the main difference is described below. In some embodiments, at least one turning point P4 include a first turning point P41 and a second turning point P42, and a height of the first turning point P41 is greater than a height of the second turning point P42. In some embodiments, the second turning point P42 is closer to a bottom 176 of the conductive pattern 470a than the first turning point P41. In some embodiments, heights of the first turning point P41 and the second turning point P42 are both at a lower level with respect to the interface (i.e., the horizontal interface) of the passivation layer 140a and the conductive pad 150. In some embodiments, a second sidewall 3741 and a second sidewall 3742 of the PPI structure 470 are connected to and disposed between the first sidewall 272 and the bottom 176 of the conductive pattern 470a of the PPI structure 470.

Figure 1F:
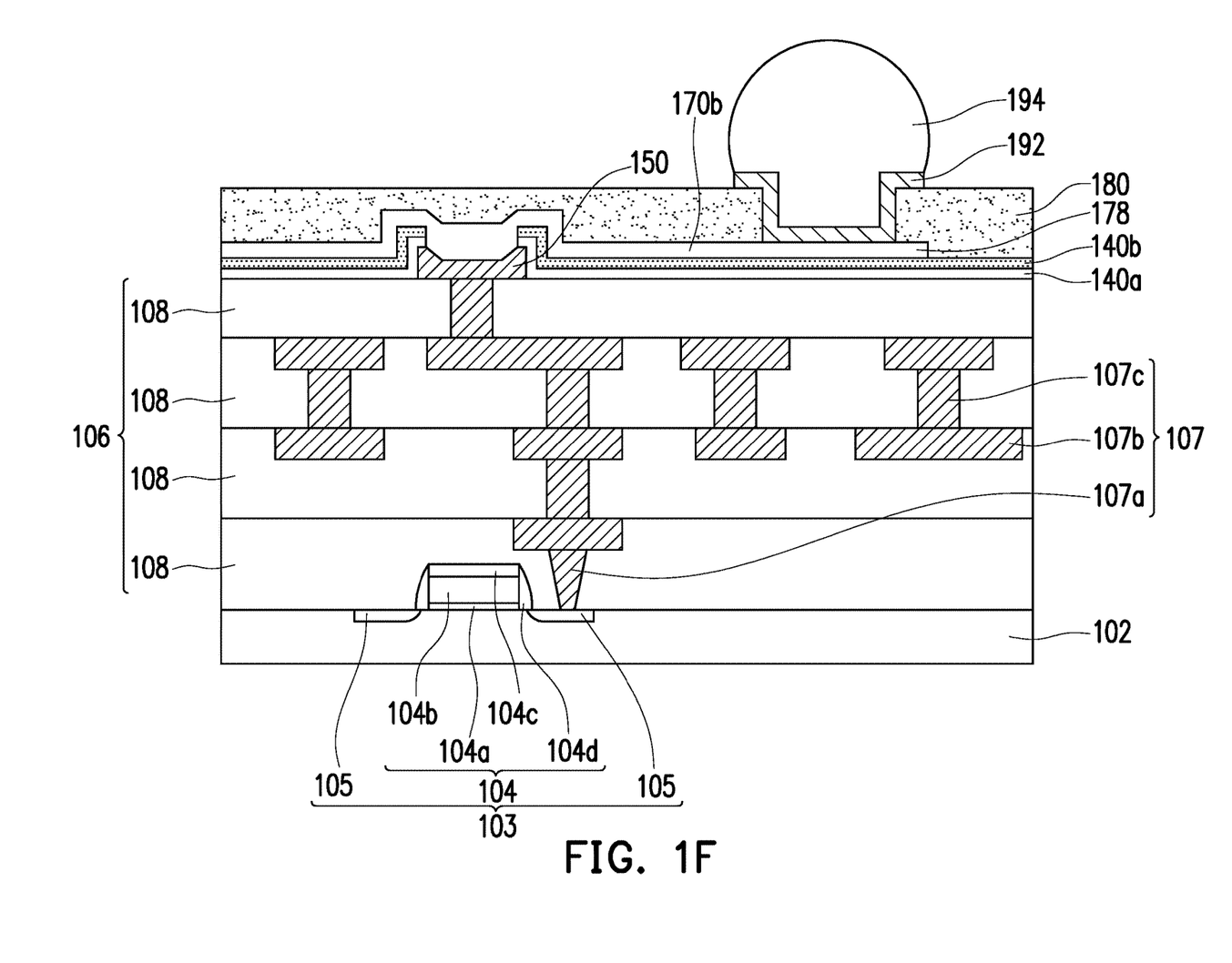

Referring to FIG. 1F, a protective layer 180 is formed over the PPI structure 170. In some embodiments, the protective layer 180 is patterned to form an opening exposing a portion of the PPI structure 170. In some embodiments, the opening exposes portion a landing pad region 178 of the PPI structure 170. The opening may be formed by an photolithography and/or etching processes, a laser drilling process, or the like. In some embodiments, the protective layer 180 is formed of a polymer layer, such as an epoxy, polyimide, benzocyclobutene (BCB), polybenzoxazole (PBO), and the like, although other relatively soft, organic, dielectric materials is also used. In alternative embodiments, the protective layer 180 is formed of a non-organic material selected from un-doped silicate glass (USG), silicon nitride, silicon oxynitride, silicon oxide, and combinations thereof.

Next, an under bump metallization (UBM) layer 192 and a conductive terminal 194 are successively formed over and electrically connected to the PPI structure 170. In some embodiments, the UBM layer 192 and the conductive terminal 194 is formed on the landing pad region 178, and the UBM layer 192 is electrically connected to the PPI structure 170 and the conductive terminal 194. In some embodiments, the UBM layer 192 include at least one metallization layer including titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the UBM layer 192 includes at least one Ti-containing layer and at least one Cu-containing layer. In some embodiments, the conductive terminal 194 is a solder bump, a Cu bump or a metal bump including Ni or Au. In some embodiments, the conductive terminal 194 is a solder bump formed by attaching a solder ball to the UBM layer 192 and then thermally reflowing the solder ball. In some embodiments, the solder bump includes a lead-free pre-solder layer, SnAg, or a solder material including alloys of tin, lead, silver, copper, nickel, bismuth, or combinations thereof. In some embodiments, the solder bump is formed by plating a solder layer with photolithography technologies followed by reflowing processes.

In some embodiments, since the polymer layer is not removed until the opening is formed, the polymer layer is used as a blocking layer, and the etching rate of the etching process during the formation of the opening is adjusted. Thus, a desired configuration of the opening with a turning point may be formed, and the conductive pad under the opening is not over-etched. Accordingly, the PPI structure may be formed with a desired configuration, the stress at the bottom corner of the PPI structure is reduced and the performance of the PPI structure in the thermal shock test is improved.

In accordance with some embodiments of the disclosure, a semiconductor device includes a semiconductor substrate, a passivation layer and a conductive pattern. The semiconductor substrate includes a conductive pad thereover. The passivation layer over the semiconductor substrate. The conductive pattern is penetrating through the passivation layer and electrically connected to the conductive pad, wherein a sidewall of the conductive pattern has at least one turning point.

In accordance with some embodiments of the disclosure, a semiconductor device includes a semiconductor substrate, a passivation layer, a post-passivation interconnect (PPI) structure and a conductive terminal. The semiconductor substrate includes a conductive pad thereover. The passivation layer over the semiconductor substrate. The PPI structure is disposed over the passivation layer and electrically connected to the conductive pad. The PPI structure includes a first portion including a first sidewall, a second sidewall and a bottom, the second sidewall disposed between the first sidewall and the bottom. A first angle formed between the first sidewall and the second sidewall is an obtuse angle, and a second angle formed between the second sidewall and the bottom is an obtuse angle. The conductive terminal is disposed over and electrically connected to the PPI structure.

In accordance with some embodiments of the disclosure, a manufacturing method of a semiconductor device is provided. A semiconductor substrate is provided. The semiconductor substrate includes a conductive pad thereover. A passivation layer is formed over the conductive pad. A photoresist layer is formed over the passivation layer. Using the photoresist layer as a mask, removing portions of the passivation layer and the conductive pad by an etching process to form an opening. During removing the portions of the passivation layer and the conductive pad, a polymer layer formed of residues of the etching process is continuously deposited in the opening without being removed. After the opening is formed, removing the photoresist layer and the polymer layer. A conductive pattern is formed in the opening to electrically connect to the conductive pad.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor device, comprising:
    a semiconductor substrate, comprising a conductive pad thereover;
    a passivation layer over the semiconductor substrate;
    a post-passivation interconnect (PPI) structure, disposed over the passivation layer and electrically connected to the conductive pad, wherein the PPI structure comprises a first portion including a first sidewall, a second sidewall and a bottom, the second sidewall is disposed between the first sidewall and the bottom, a first angle formed between the first sidewall and the second sidewall is an obtuse angle, and a second angle formed between the second sidewall and the bottom is an obtuse angle, wherein part of the first portion is partially embedded in the conductive pad; and
    a conductive terminal, disposed over and electrically connected to the PPI structure.

2. The semiconductor device as claimed in claim 1, wherein the first sidewall is a substantially vertical to the bottom.

3. The semiconductor device as claimed in claim 1, wherein the semiconductor substrate comprises an active device, and an interconnect structure between the active device and the conductive pad.

4. The semiconductor device as claimed in claim 1, wherein the PPI structure comprises a second portion, and the second portion of the PPI structure extends over the passivation layer and electrically connected to the first portion and the conductive terminal.

5. A semiconductor device, comprising:
    a semiconductor substrate, comprising a conductive pad thereover;
    a passivation layer over the semiconductor substrate;
    a post-passivation interconnect (PPI) structure disposed over the passivation layer and electrically connected to the conductive pad, wherein the PPI structure comprises a first portion including a first sidewall, a second sidewall and a bottom, the second sidewall being disposed between the first sidewall and the bottom, wherein a first angle formed between the first sidewall and the second sidewall is an obtuse angle, and a second angle formed between the second sidewall and the bottom is an obtuse angle, wherein the conductive pad has an inclined sidewall contacting with and electrically connecting to the first portion of the PPI structure; and
    a conductive terminal, disposed over and electrically connected to the PPI structure.

6. The semiconductor device as claimed in claim 5, wherein the conductive pattern penetrates the passivation layer to electrically connect the conductive pad.

7. The semiconductor device as claimed in claim 5, wherein the first angle is substantially formed at a same level with an interface of the passivation layer and the conductive pad.

8. The semiconductor device as claimed in claim 5, wherein the first angle is formed at a lower level with respect to an interface of the passivation layer and the conductive pad.

9. The semiconductor device as claimed in claim 5, wherein the first sidewall is in direct contact with the passivation layer.

10. The semiconductor device as claimed in claim 5, wherein the first sidewall is in direct contact with the passivation layer and the conductive pad.

11. The semiconductor device as claimed in claim 5, wherein the first portion further includes a horizontal sidewall connecting the first sidewall, and the first sidewall is disposed between the horizontal sidewall and the second sidewall.

12. The semiconductor device as claimed in claim 5, wherein a topmost surface of the first portion has a recess above the bottom, and a sidewall and a bottom of the recess is substantially conformal with the second sidewall and the bottom of the first portion.

13. The semiconductor device as claimed in claim 5, wherein the first portion further comprises a third sidewall, the first sidewall is disposed between the second and third sidewalls, and a third angle formed between the third sidewall and the second sidewall is an obtuse angle.

14. The semiconductor device as claimed in claim 5, wherein the conductive pad further comprises a horizontal portion and a bottom, the inclined sidewall is disposed between the horizontal portion and the bottom, and the horizontal portion is in direct contact with the passivation layer.

15. A semiconductor device, comprising:
a semiconductor substrate, comprising a conductive pad thereover;
a passivation layer over the semiconductor substrate;
a post-passivation interconnect (PPI) structure, disposed over the passivation layer and electrically connected to the conductive pad, wherein the PPI structure comprises a first portion including a first surface, a first sidewall, a second sidewall and a bottom, the first surface is in direct contact with the passivation layer, the first sidewall is disposed between the first surface and the second sidewall, the second sidewall is disposed between the first sidewall and the bottom, a first angle formed between the first sidewall and the second sidewall is an obtuse angle, and a second angle formed between the second sidewall and the bottom is an obtuse angle; and
a conductive terminal, disposed over and electrically connected to the PPI structure.

16. The semiconductor device as claimed in claim 15, wherein a projection of the first portion of the PPI structure onto the semiconductor substrate is not overlapped with a projection of the conductive terminal onto the semiconductor substrate.

17. The semiconductor device as claimed in claim 15, further comprising an under bump metallization (UBM) layer disposed between and in direct contact with the conductive terminal and the PPI structure.

18. The semiconductor device as claimed in claim 17, wherein a projection of the first portion of the PPI structure onto the semiconductor substrate is not overlapped with a projection of the UBM layer onto the semiconductor substrate.

19. The semiconductor device as claimed in claim 15, wherein the first surface is substantially parallel to the bottom.

20. The semiconductor device as claimed in claim 15, wherein the first surface is extended on the passivation layer.

* * * * *